(12) United States Patent
Wang

(10) Patent No.: US 11,233,313 B2
(45) Date of Patent: Jan. 25, 2022

(54) METHOD FOR MANUFACTURING REAR COVER, REAR COVER AND ELECTRONIC DEVICE HAVING THE SAME

(71) Applicant: GUANGDONG OPPO MOBILE TELECOMMUNICATIONS CORP., LTD., Guangdong (CN)

(72) Inventor: Xiaobing Wang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 780 days.

(21) Appl. No.: 16/032,891

(22) Filed: Jul. 11, 2018

(65) Prior Publication Data

US 2019/0027813 A1 Jan. 24, 2019

(30) Foreign Application Priority Data

Jul. 21, 2017 (CN) .......................... 201710602869.7

(51) Int. Cl.
*H01Q 1/24* (2006.01)
*B29C 70/74* (2006.01)
(Continued)

(52) U.S. Cl.
CPC ............. *H01Q 1/243* (2013.01); *B29C 39/10* (2013.01); *B29C 45/14311* (2013.01);
(Continued)

(58) Field of Classification Search
CPC ........ H01Q 1/243; H01Q 13/103; H01Q 1/22; B29C 45/14311; B29C 45/14344; B29C 70/745; B29C 67/004; B29C 39/10; B29C 2045/14319; B29C 2045/1693; H05K 5/0247; B29K 2705/00; B29K 2995/003; B29L 2031/3481; B29L 2031/3437; B29L 2009/003

See application file for complete search history.

(56) References Cited

U.S. PATENT DOCUMENTS

| | | | |
|---|---|---|---|
| 6,400,571 B1 | 6/2002 | Kimura et al. | |
| 2002/0014666 A1* | 2/2002 | Ohmi ................ | H01L 21/28211 257/368 |
| 2013/0280550 A1 | 10/2013 | Huang et al. | |

FOREIGN PATENT DOCUMENTS

| | | |
|---|---|---|
| CN | 104066293 A | 9/2014 |
| CN | 104468885 A | 3/2015 |

(Continued)

OTHER PUBLICATIONS

Second office action issued in a corresponding Chinese application No. 201710602869.7, dated Jun. 18, 2019 (10 pages).

(Continued)

*Primary Examiner* — Matthew Mikels
(74) *Attorney, Agent, or Firm* — Hodgson Russ LLP

(57) ABSTRACT

A method for manufacturing a rear cover is provided. A housing is provided. The housing has a metal layer and a plastic layer. The metal layer has a first surface and a second surface. The plastic layer is formed on the first surface. A slot is defined in the metal layer. The slot passes through the first surface and the second surface of the metal layer. An unshielded portion is formed in the slot. A rear cover and an electronic device having the rear cover are also provided.

20 Claims, 12 Drawing Sheets

(51) Int. Cl.
  *B29C 39/10* (2006.01)
  *B29C 67/00* (2017.01)
  *B29C 45/14* (2006.01)
  *H01Q 13/10* (2006.01)
  *H05K 5/02* (2006.01)
  *B29L 31/34* (2006.01)
  *B29L 9/00* (2006.01)
  *B29K 705/00* (2006.01)
  *B29C 45/16* (2006.01)

(52) U.S. Cl.
  CPC ...... *B29C 45/14344* (2013.01); *B29C 67/004* (2013.01); *B29C 70/745* (2013.01); *H01Q 13/103* (2013.01); *H05K 5/0247* (2013.01); *B29C 2045/14319* (2013.01); *B29C 2045/1693* (2013.01); *B29K 2705/00* (2013.01); *B29K 2995/0003* (2013.01); *B29L 2009/003* (2013.01); *B29L 2031/3437* (2013.01); *B29L 2031/3481* (2013.01)

(56) References Cited

FOREIGN PATENT DOCUMENTS

| | | |
|---|---|---|
| CN | 105120625 A | 12/2015 |
| CN | 105392316 A | 3/2016 |
| CN | 105530782 A | 4/2016 |
| CN | 105530788 A | 4/2016 |
| CN | 106514153 A | 3/2017 |
| CN | 106785432 A | 5/2017 |
| CN | 106816687 A | 6/2017 |
| CN | 106848538 A | 6/2017 |
| CN | 106856527 A | 6/2017 |
| CN | 206472168 U | 9/2017 |
| CN | 107517551 A | 12/2017 |
| CN | 107896460 A | 4/2018 |
| CN | 107896461 A | 4/2018 |
| CN | 107962348 A | 4/2018 |
| CN | 107992161 A | 5/2018 |
| KR | 20170082601 A | 7/2017 |
| TW | 201334664 A | 8/2013 |
| WO | 2016101879 A1 | 6/2016 |

OTHER PUBLICATIONS

Third office action issued in a corresponding Chinese application No. 201710602869.7, dated Oct. 9, 2019 (9 pages).
Decision of rejection issued in a corresponding Chinese application No. 201710602869.7, dated Jan. 20, 2020 (16 pages).
Examination report issued in a contespending India application No. 201814026888, dated Jun. 1, 2020 (7 pages).
China Search Report issued in corresponding China Application No. 201710602869.7, dated Feb. 3, 2019 (13 pages).
European Search Report dated Aug. 23, 2018 for Application No. EP 18 18 2913.
International Search Report and Written Opinion dated Oct. 22, 2018 for Application No. PCT/CN2018/095983.

* cited by examiner

METHOD FOR MANUFACTURING REAR COVER, REAR COVER AND ELECTRONIC DEVICE HAVING THE SAME

CROSS-REFERENCE TO RELATED APPLICATION

This application claims priority to a Chinese application No. 201710602869.7 filed on Jul. 21, 2017, titled "Method for manufacturing rear cover, rear cover and electronic device having the same". The entirety of the above-mentioned applications is hereby incorporated by reference herein.

TECHNICAL FIELD

The present disclosure relates to the field of consumer electronics in general. More particularly, and without limitation, the disclosed embodiments relate to a rear cover and an electronic device having the same, and a method for manufacturing a rear cover.

BACKGROUND

An electronic device such as a mobile phone or a tablet can include a metal housing. The metal housing needs to define slots to allow signals to transmits therethrough. Thus, the signals are not be shielded.

SUMMARY

In accordance with an aspect, in one embodiment of the present disclosure, a method for manufacturing a rear cover is provided. In the method, a housing having a metal layer and a plastic layer can be provided. The metal layer can include a first surface and a second surface. The plastic layer can be formed on the first surface. A slot can be defined in the metal layer. The slot can pass through the first surface and the second surface of the metal layer. An unshielded portion can be formed in the slot.

In accordance with another aspect, in one embodiment of the present disclosure, a rear cover is provided. The rear cover can include a housing and an unshielded portion. The housing can include a metal layer and a plastic layer; the metal layer can include a first surface and a second surface. The plastic layer can be formed on the first surface. The metal layer can define a slot therein. The slot can pass the first surface and the second surface of the metal layer. The unshielded portion can be disposed in the slot.

In accordance with a still another aspect, in one embodiment of the present disclosure, an electronic device is provided. The electronic device can include base layer, a metal layer, an unshielded portion, and a feeding element. The metal layer can be attached on the base layer, and can include an upper element and a main element. A slot can be formed between the upper element and the main element. The unshielded portion can be at least partially disposed in the slot. The feeding element can be electrically coupled to the upper element of the metal layer. An antenna structure can be formed by the feeding element, the metal layer, and the slot. The upper element can be configured to be a main radiation element of the first antenna structure.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION OF EMBODIMENTS

This description and the accompanying drawings that illustrate exemplary embodiments should not be taken as limiting. Various mechanical, structural, electrical, and operational changes may be made without departing from the scope of this description and the claims, including equivalents. In some instances, well known structures and techniques have not been shown or described in detail so as not to obscure the disclosure. Similar reference numbers in two or more figures represent the same or similar elements. Furthermore, elements and their associated features that are disclosed in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

As used herein, a "communication terminal" (or simply a "terminal") includes, but is not limited to, a device that is configured to receive/transmit communication signals via a wire line connection, such as via a public-switched telephone network (PSTN), digital subscriber line (DSL), digital cable, a direct cable connection, and/or another data connection/network, and/or via a wireless interface with, for example, a cellular network, a wireless local area network (WLAN)1 a digital television network such as a DVB-H network, a satellite network, an AM/FM broadcast transmitter, and/or another communication terminal. A communication terminal that is configured to communicate over a wireless interface may be referred to as a "wireless communication terminal," a "wireless terminal" and/or a "mobile terminal." Examples of mobile terminals include, but are not limited to, a satellite or cellular radiotelephone; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver.

Figure 1:
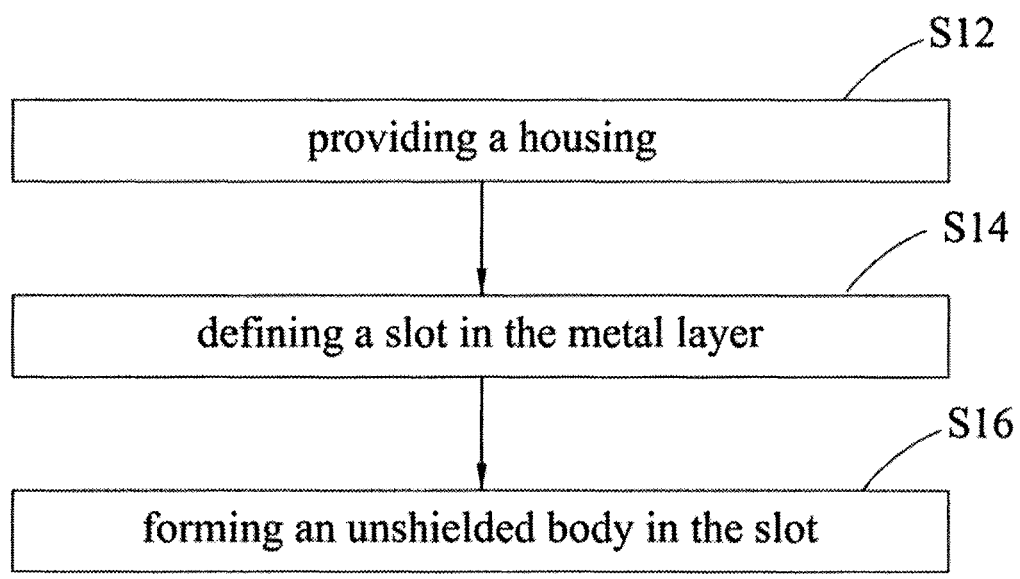
FIG. 1 illustrates a schematic flowchart of a method for manufacturing a rear cover, in accordance with one embodiment of the present disclosure.
Figure 2:
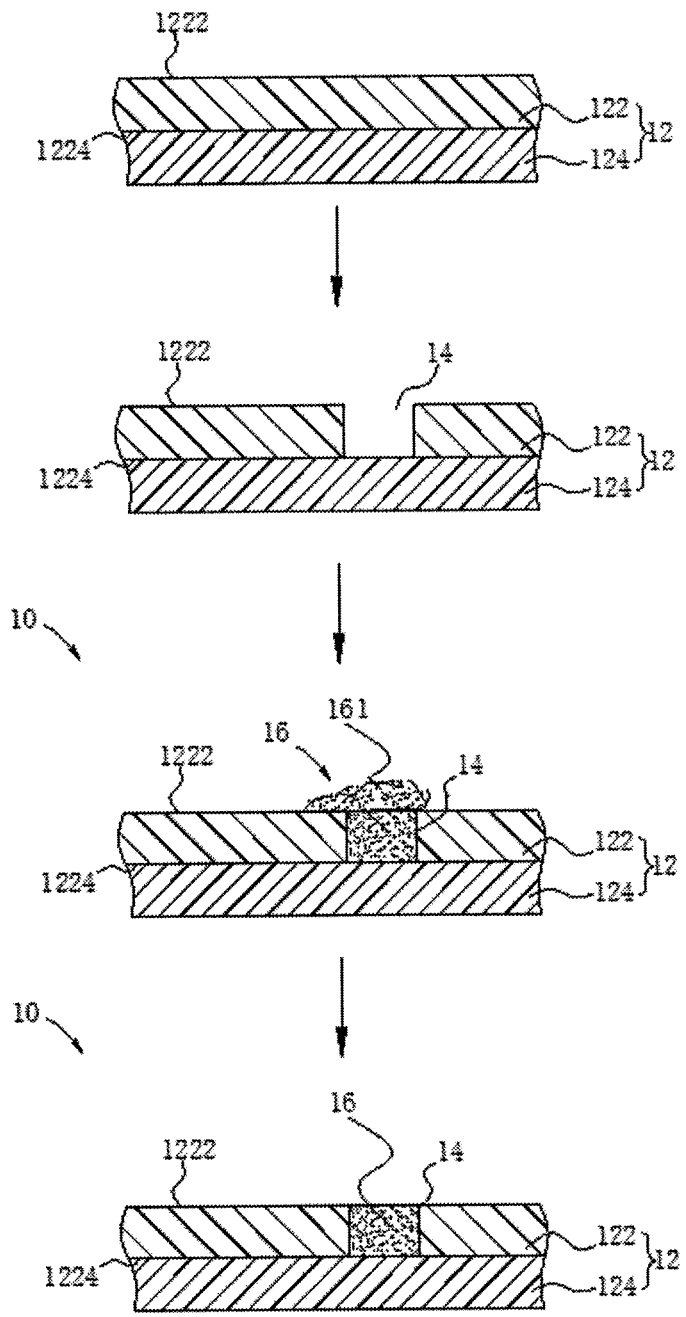
FIG. 2 illustrates a schematic view of a process of the method.

As illustrated in FIG. 1 and FIG. 2, a method for manufacturing a rear cover 10 is provided, in accordance with one embodiment of the present disclosure. The rear cover 10 can include a housing 12 and an unshielded portion 16 coupled to the housing 12. The housing 12 can define at least one antenna slot 14 therein, and the unshielded portion 16 can be received in the at least one slot 14. In one embodiment, the housing 12 can include a metal layer 12 and a plastic layer 124. The metal layer 122 can include a first surface 1224 and a second surface 1224 departing from the first surface 1224. The second surface 1224 and the first surface 1224 can be respectively disposed at two departing side surfaces of the metal layer 122. Each one of the at least one slot 14 can pass through the second surface 1224 and the first surface 1224. The plastic layer 124 can be attached on and contacted with the first surface 1224.

In one embodiment, the method for manufacturing the rear cover 10 can begin at block S12.

At block S12, a housing 12 is provided. The housing 12 has a metal layer 122 and a plastic layer 124.

In one embodiment, the housing 12 can include a metal layer 122 and a plastic layer 124. The metal layer 122 can include a first surface 1224 and a second surface 1224 departing from the first surface 1224. The second surface 1224 and the first surface 1224 can be respectively disposed at two departing side surfaces of the metal layer 122. The plastic layer 124 can be formed on and contacted with the first surface 1224.

Figure 3:
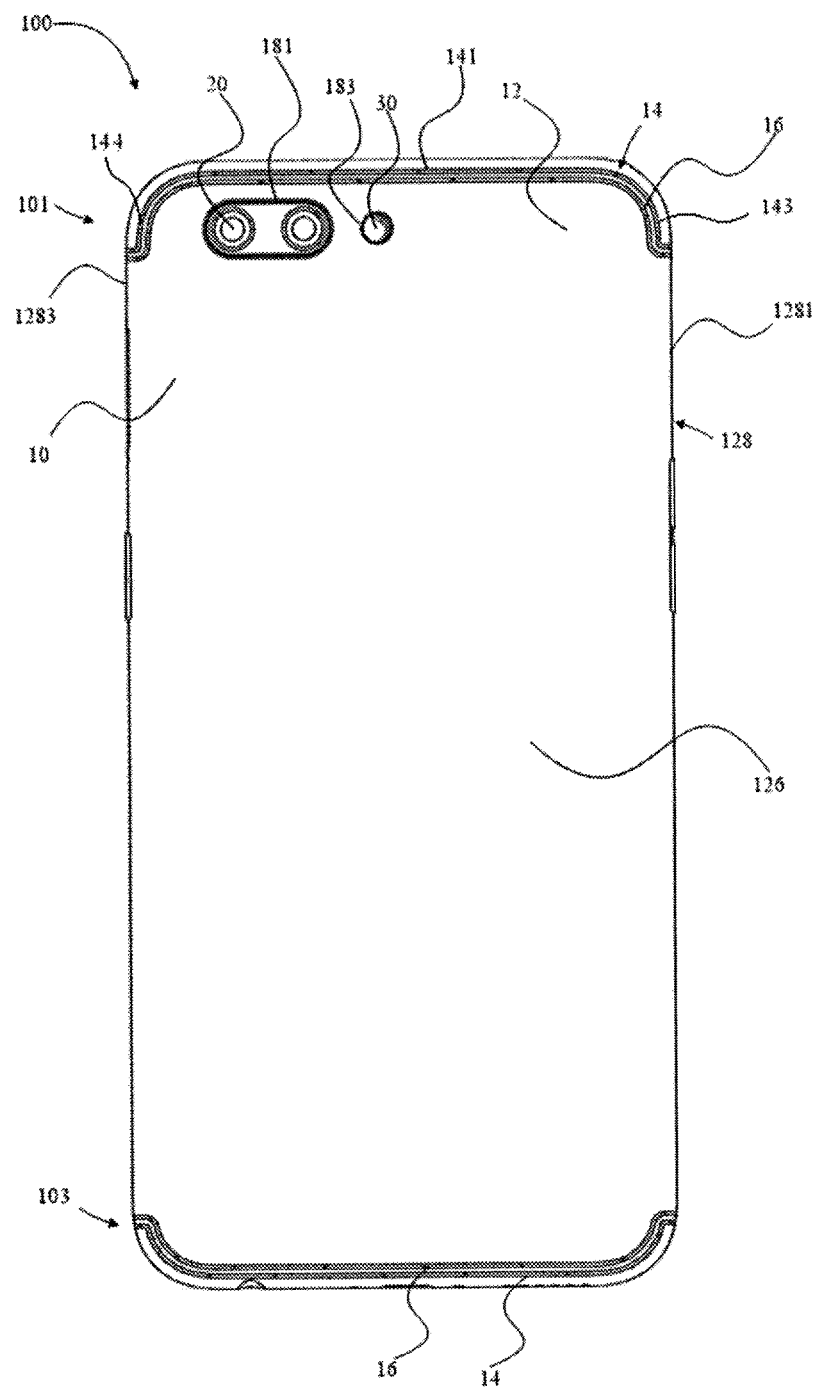
FIG. 3 illustrates a schematic view of an electronic device including a rear cover, in accordance with one embodiment of the present disclosure.

Specifically, the housing 12 can have the target shape, that is, a shape of the housing 12 can correspond to and match with a shape of the rear cover 10 of an electronic device 100. As illustrated in FIG. 3, in accordance with one embodiment of the present disclosure, the electronic device 100 can be a mobile phone; and the rear cover 10 can be provided as a rear cover/battery cover of the mobile phone. The housing 12 can include a flat portion 126 and a sidewall 128 extending from a periphery of the flat portion 126. The sidewall 128 can include an exterior surface in an arc-shaped configuration.

Figure 4:
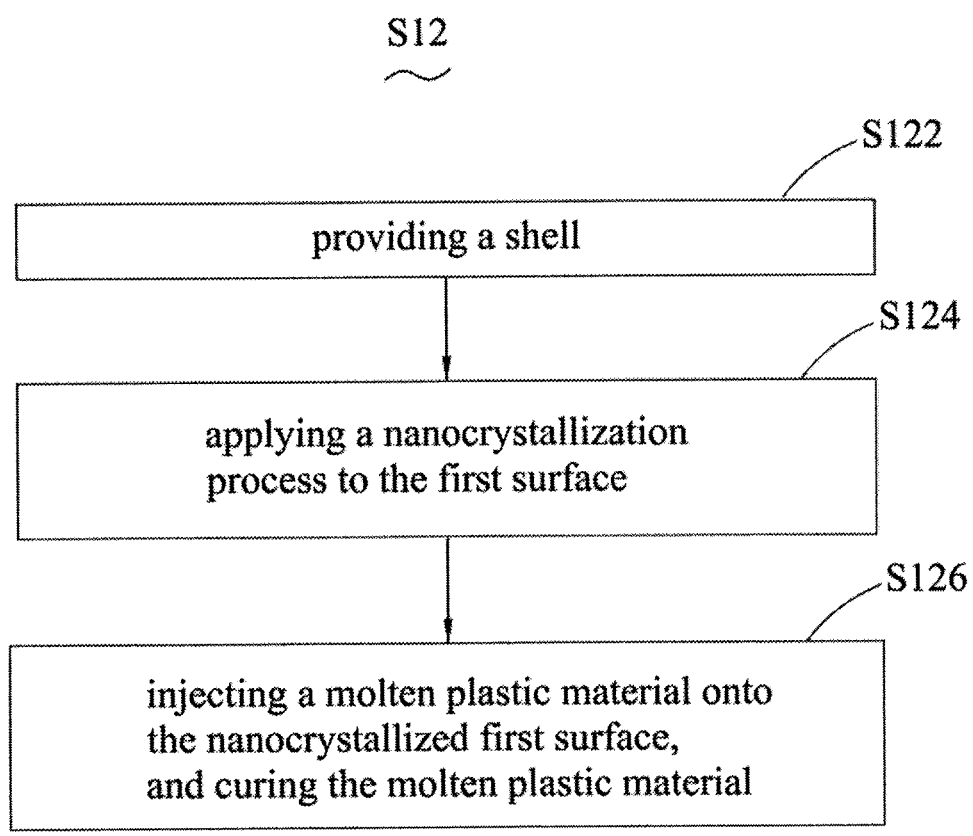
FIG. 4 illustrates a schematic flowchart of a method for manufacturing a rear cover, in accordance with another embodiment of the present disclosure.

As illustrated in FIG. 4, in some embodiments, a method for manufacturing the housing 12 can begin at block S122.

At block S122, a shell is provided. The shell has the metal layer 122.

In one embodiment, a shell is provided. The shell can include the metal layer 122, and the first surface 1224 of the metal layer 122 can be exposed.

At block S124, a nanocrystallization process is applied to the first surface 1224.

At block S126, a molten plastic material is injected onto the nanocrystallized first surface 1224, and the molten plastic material is cured to form the plastic layer 124.

In this way, the plastic layer 124 can be formed on and contacted with the metal layer 122, and the housing 12 with high quality can be obtained.

Specifically, at block S122, a shape of the shell can match a target shape of the rear cover 10 of the electronic device 100. That is, the shell having the target shape should be processed in advance, and then be provided. For example, the shell can be obtained by a stamping process, and then the plastic layer 124 can be formed on the shell. Thus, a manufacturing process of the housing 12 can be simplified.

At block S14, a slot 14 is defined in the metal layer 122.

In one embodiment, the slot 14 can pass the second surface 1224 and the first surface 1224 of the metal layer 122. In one embodiment, the housing 12 can define one slot 14. In some alternative embodiment, the housing 12 can define two or more slots 14. That is, an amount of the slots 14 can be 1, 2, 3, 4 or more.

In one embodiment, a depth of the slot 14 can be greater than or equal to a thickness of the metal layer 122, and the depth of the slot 14 can be less than or equal to a sum of the thickness of the metal layer 122 and a thickness of the plastic layer 124.

Figure 5:
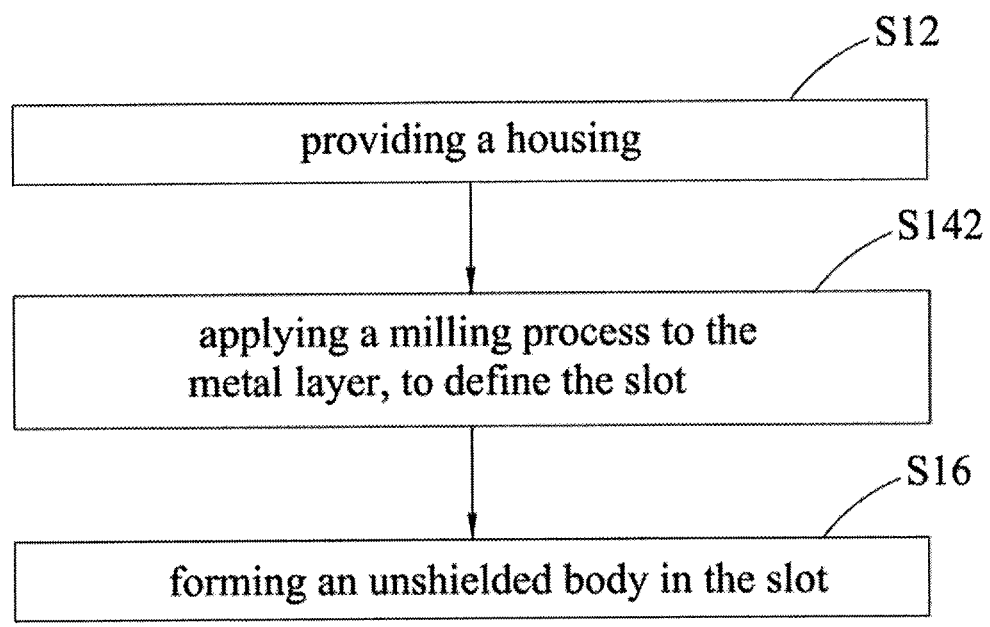
FIG. 5 illustrates a schematic flowchart of a method for manufacturing a rear cover, in accordance with still another embodiment of the present disclosure.

As illustrated in FIG. 5, in some embodiments, a method for defining the slot 14 can begin at block S142, At block S142, a milling process is applied to the metal layer 122 to define the slot 14.

In this way, a processing manner of the housing 12 is simplified and a high machining accuracy can be obtained. Thus, the production cost can be reduced and the production efficiency can be increased. Of course, the slot 14 can also be defined by other methods such as a laser processing.

Figure 6:
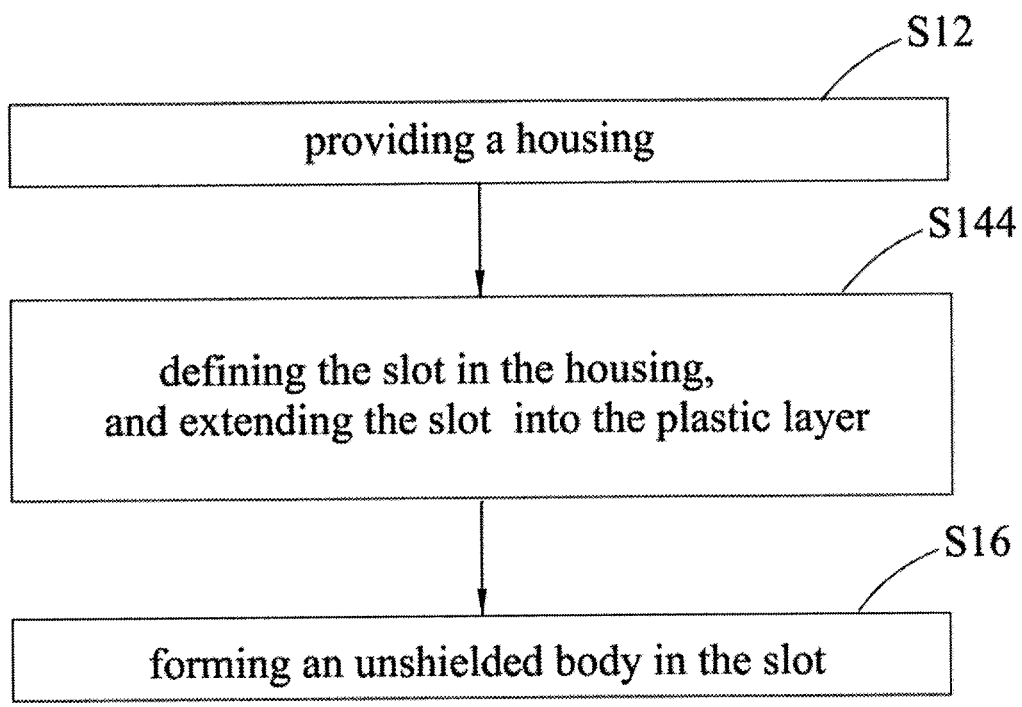
FIG. 6 illustrates a schematic flowchart of a method for manufacturing a rear cover, in accordance with further another embodiment of the present disclosure.
Figure 7:
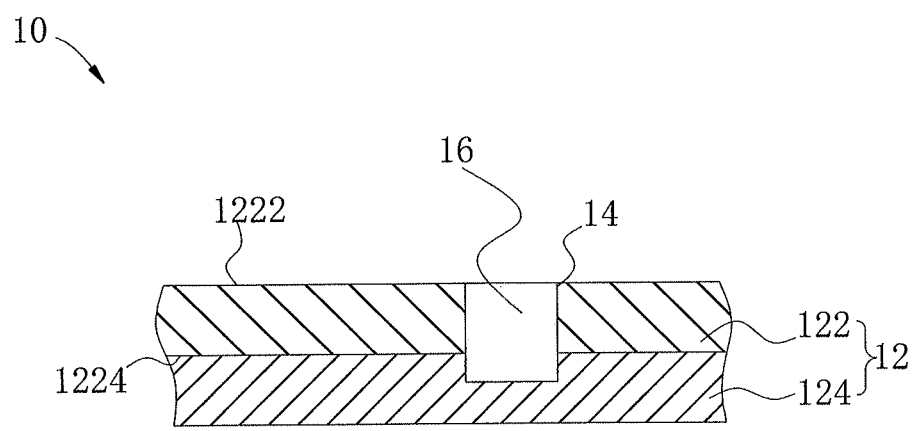
FIG. 7 illustrates a partial cross-sectional schematic view of a rear cover, in accordance with one embodiment of the present disclosure.

As illustrated in FIG. 6 and FIG. 7, in some alternative embodiments, a method for defining the slot 14 can begin at block S144, At block S144, a slot 14 is defined in the housing 12, and the slot 14 extends into the plastic layer 124.

In an alternative embodiment, the slot 14 can extend from the second surface 1224 to the first surface 1224 and pass through the metal layer 122 to extend into the plastic layer 124.

In this way, the slot 14 can extend into the plastic layer 124. Thus, the metal layer 122 can be divided into two parts by the slot 14. In addition, the plastic layer 124 can not shield signals. Thus, the electronic device 100 can be capable of transmitting signals through the slot 14 to the outside of the electronic device 100, and receiving signals from the outside of the electronic device 100 through the slot 14.

In one embodiment, the depth of the slot 14 can be greater than the thickness of the metal layer 122, while less than the sum of the thickness of the metal layer 122 and the thickness of the plastic layer 124. Therefore, the slot 14 can extend into the plastic layer 124 but does not pass through the plastic layer 124, and the unshielded portion 16 can be partially inserted into the plastic layer 124.

In an alternative embodiment, the slot 14 can extend from a side of the house 12 to another side of the house 12. Specially, the sidewall 128 can include a first portion 1281 and a second portion 1283. The first portion 1281 and the second portion 1283 can be coupled to opposite sides of the flat portion 126, respectively. Specially, the first portion 1281 can be provided as a left border of the housing 12, while the second portion 1283 can be provided as a right border of the housing 12. In an alternative embodiment, the first portion 1281 can be provided as a top border of the housing 12, while the second portion 1283 can be provided as a bottom border of the housing 12. It can be understood that the above words of location of the housing 12 should be referred to a user's position when using the electronic device 100.

The slot 14 can extend from the first portion 1281 to the second portion 1283. It can be understood that the slot 14 can extend from the first portion 1281, across the flat portion 126, to the second portion 1283 successively. The metal layer 122 can be made of aluminum alloy. Of course, in some alternative embodiments, the metal layer 122 can be made of other materials such as stainless steel or magnesium alloy.

Because the slot 14 extends from the first portion 1281 to the second portion 1283, the metal layer 122 is divided into two parts by the slot 14. However, the slot 14 does not pass through the plastic layer 124. Thus, the two parts of the metal layer 122 can be coupled to each other by the plastic layer 124 and an unshielded portion 16 (formed at block S16). As a result, the housing 12 can remain as a whole component.

Figure 8:
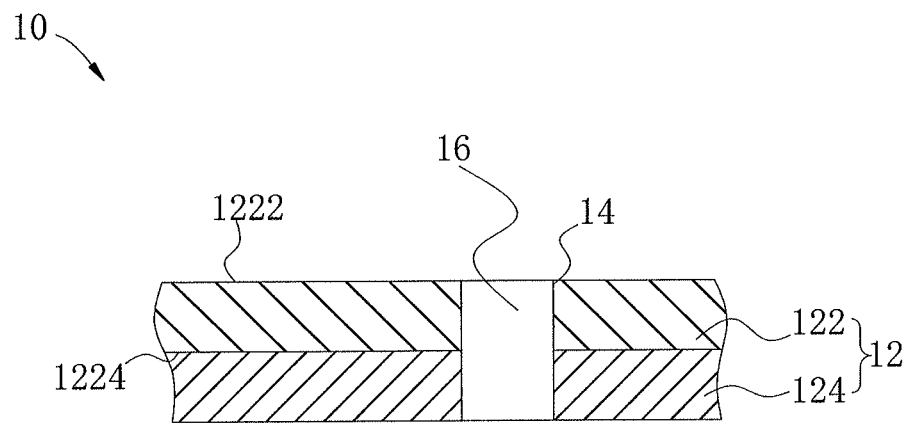
FIG. 8 illustrates a partial cross-sectional view of a rear cover, in accordance with another embodiment of the present disclosure.

It is noted that, in other alternative embodiments, the slot 14 may also completely pass through the metal layer 122 and the plastic layer 124 (as illustrated in FIG. 8). In other words, the depth of the slot 14 can be equal to the sum of the thicknesses of the metal layer 122 and the plastic layer 124. The housing 12 can be divided into two parts by the slot 14. Thus, the two parts of the metal layer 122 can be coupled to each other by the unshielded portion 16.

At block S16, a unshielded portion 16 is formed in the slot 14.

Specially, an unshielded material can be disposed in the slot 14 to form the unshielded portion 16. The unshielded portion 16 can be completely or partially received in the slot 14. In this way, it is facilitated to fill the slot 14 with the unshielded material to form the unshielded portion 16.

Figure 9:
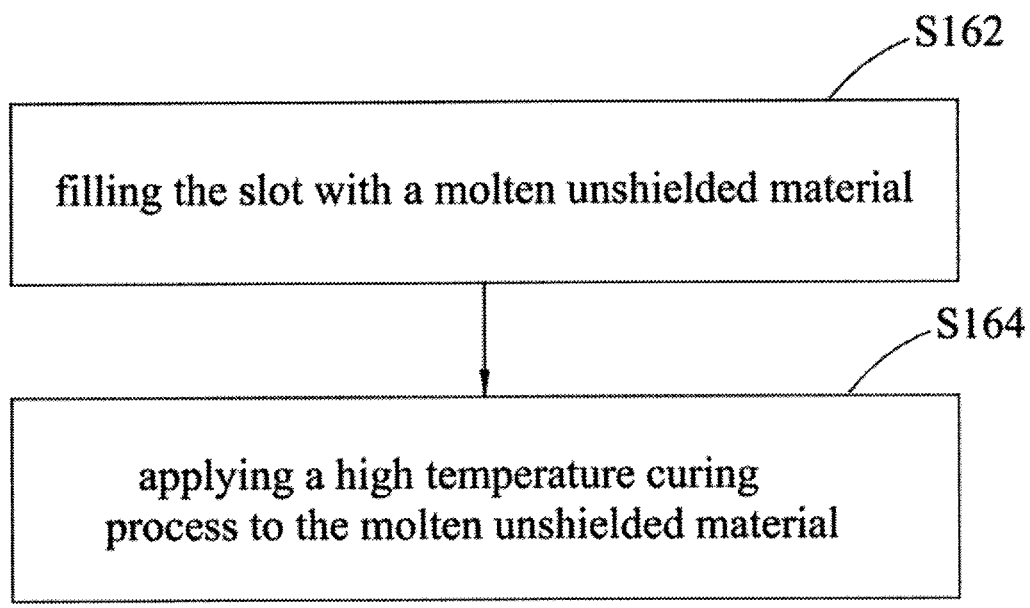
FIG. 9 illustrates a schematic flowchart of a method for manufacturing a rear cover, in accordance with still another embodiment of the present disclosure.

As illustrated in FIG. 9, in some alternative embodiments, a method for forming the unshielded portion 16 can begin at block S162.

At block S162, the slot 14 is filled with a molten unshielded material.

At block S164, a high temperature curing process is applied to the molten unshielded material.

Thus, the unshielded portion 16 can be formed and completely or partially received in the slot 14, and the rear cover 10 can be formed. In this way, the slot 14 can be filled with the molten unshielded material uniformly, thereby avoiding gaps between the unshielded portion 16 and the metal layer and intervals in the unshielded portion 16. Thus, a product quality of the rear cover 10 with the antenna slot 14 can be improved.

Specifically, the unshielded portion 16 may be made of plastic material. That is, the unshielded material can be a plastic material. The plastic material in a molten state may flow and may better fit with the slot 14 to fill the slot 14. After the slot 14 is filled with the molten unshielded material, the molten unshielded material is cured at a high temperature. Thus, the unshielded portion 16 can be formed in a solid state, and the unshielded portion 16 can be embedded in the metal layer 122.

In some embodiments, the unshielded portion 16 can be made of a material different from the plastic layer 124.

In this way, since the plastic material is easily to be molten and cured, the plastic material can be disposed into the slot 14 in a molten state, and then the molten plastic material can be cured into a solid state. Therefore, the process of manufacturing the rear cover 10 can be simplified, and the production efficiency can be improved. In addition, the plastic material can be easily to obtained, and the signals can not be shielded by the plastic material.

In accordance with embodiments of the present disclosure, in the method for manufacturing the rear cover 10, the housing 12 can be provided with a configuration of a target shaped in advanced, and then the slot 14 is defined in the housing 12. The rear cover 10 can be obtained after forming the unshielded portion 16 in the slot 14. A process of manufacturing the rear cover 10 is simplified, and a high utilization rate of raw materials can be achieved. Thus, the production efficiency can be increased and the production cost can be reduced.

It can be understood that the rear cover 10 obtained by the method can be applied to an electronic device 100 (as illustrated in FIG. 3) such as a mobile phone, a tablet computer, or a smart wearable device. One or more antennas disposed in the electronic device 100 can be capable of transmitting signals through the slot 14.

Figure 10:
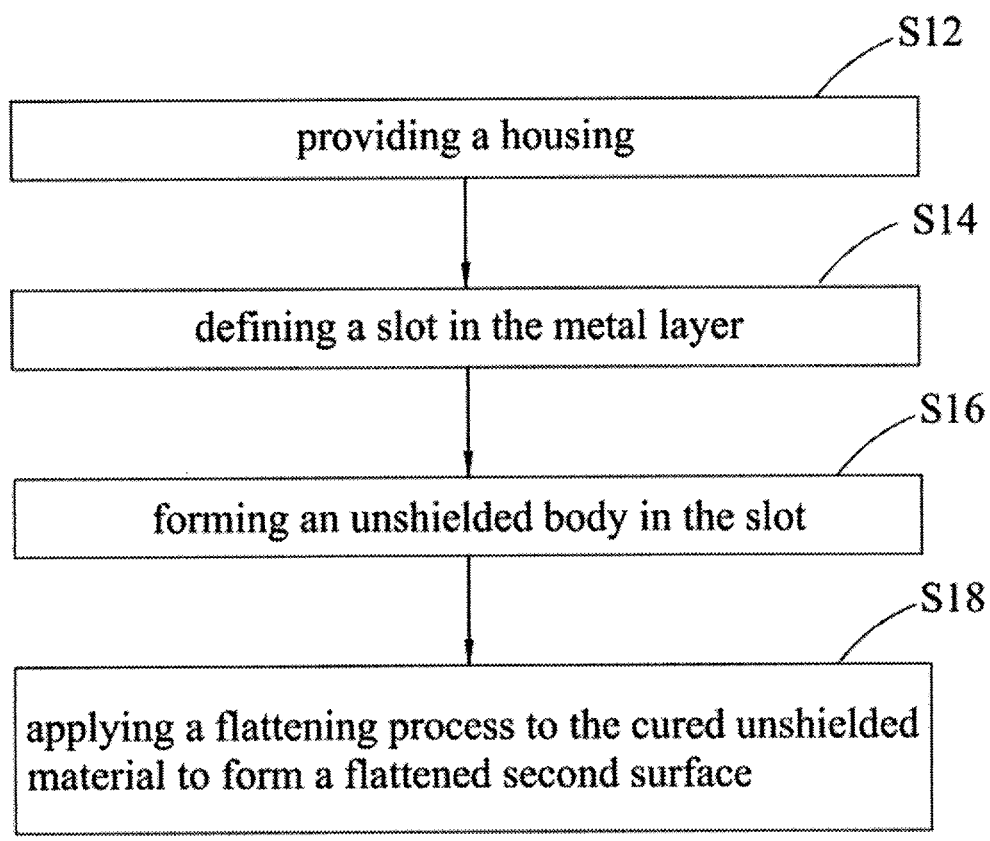
FIG. 10 illustrates a schematic flowchart of a method of manufacturing a rear cover, in accordance with further another embodiment of the present disclosure.

As illustrated in FIG. 10, in some alternative embodiments, the method for manufacturing the rear cover 10 can continue with block S18.

At block S18, a flattening process is applied to the cured unshielded material to form a flattened second surface 1224.

In other words, a protruding portion 161 of the unshielded portion 16 protruding from the second surface 1224 can be removed, so that the second surface 1224 of the rear cover 10 is flattened. In some embodiment, after filling the slot 14 with the unshielded material in a molten state, the molten unshielded material may overflow the slot 14. After the curing process, the protruding portion 161 protruding from the second surface 1224 may be formed. The protruding portion 161 should be removed to form a flattened second surface 1224. In this way, the rear cover 10 can have a better appearance.

It can be understood that, the second surface 1224 of the metal layer 122 can be considered as the second surface 1224 of the rear cover 10.

In particular, the protruding portion 161 protruding from the second surface 1224 can be removed by a grinding or milling process. In other alternative embodiments, the protruding portion 161 can also be removed by a laser process.

Further, after the second surface 1224 is flattened, the second surface 1224 can be polished, so that the second surface 1224 of the rear cover 10 can have a better appearance.

In the illustrated embodiments described above, the slot 14 can be filled with the unshielded portion 16. In an alternative embodiment, the molten unshielded material does not overflow the slot 14, and the block S18 can be omitted. The depth of the slot 14 can be greater than a thickness of the unshielded portion 16.

Figure 11:
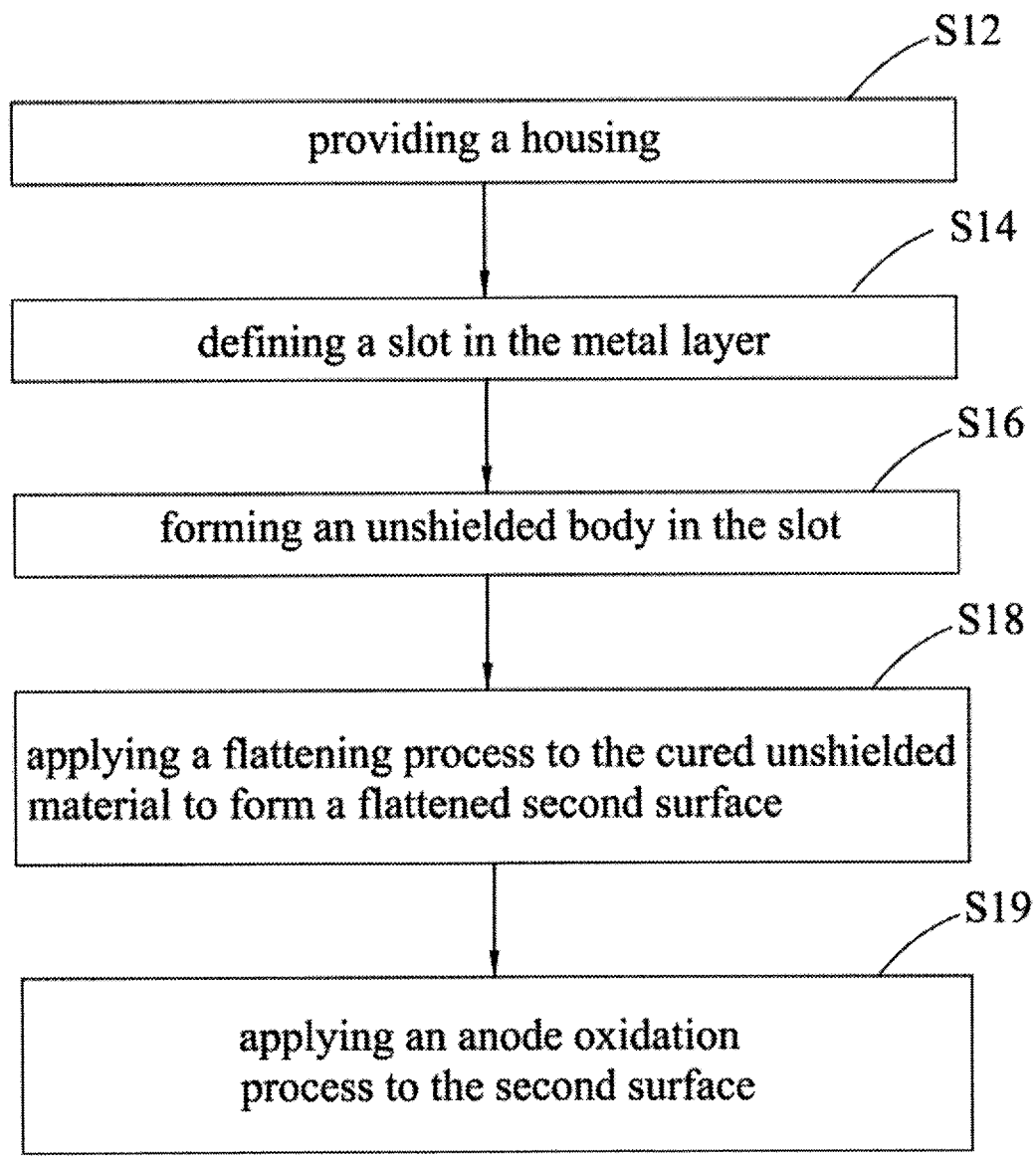
FIG. 11 illustrates a schematic flowchart of a method of manufacturing a rear cover, in accordance with further another embodiment of the present disclosure.

As illustrated in FIG. 11, in some embodiments, the method for manufacturing the rear cover 10 can further continue with block S19, At block S19, an anode oxidation process is applied to the second surface 1224.

In this way, after the oxidation process, the second surface 1224 can have a high performance in corrosion resistance and a wear resistance, and a hardness of the rear cover 10 can be enhanced. Thus, a service life of the rear cover 10 can be increased.

In some embodiments, the rear cover 10 can be applied to the electronic device 100 (as illustrated in FIG. 3). The housing 12 can define at least one through hole therein. The at least one through hole can be configured to accommodate and/or expose components of the electronic device 100.

In this way, it is facilitated to accommodate and/or expose the components of the electronic device 100 through the at least one through hole. Thus, an assembly efficiency of the electronic device 100 can be increased.

In one embodiment, the electronic device 100 can include a camera 20 and a flasher 30. The camera 20 and the flasher 30 can be disposed in the housing 12. Furthermore, the housing 12 can define at least one through hole to expose the camera 20 and the flasher 30. In addition, the method for manufacturing the rear cover 10 can further continue with a method for defining at least one through hole in the housing.

In specially, the housing 12 can define a first through hole 181 at a position corresponding to the camera 20, and a second through hole 183 at a position corresponding to the flasher 30. The first through hole 181 can be configured to expose the camera 20, so that the camera 20 can capture an image outside the electronic device 100. The second through hole 183 can be configured to expose the flashes 30. Thus, the light emitted from the flasher 30 can pass through the second through hole 183 to outside of the electronic device 100.

In some alternative embodiments, a configuration of the slot 14 can be substantially C-shaped.

Specially, the slot 14 in the metal layer 122 can extend along a contour of the housing 12. The contour of the housing 12 can be substantially a rounded rectangle. The slot 14 can be defined at an end of the housing 12 such that the slot 14 can substantially have a C-shape.

Further, as illustrated in FIG. 3, the flat portion 126 can be substantially a rectangular plate, and the slot 14 can be defined at an end of the flat portion 126. The slot 14 can extend along a contour of the end of the flat portion 126. In one embodiment, the slot 14 can include a first extending portion 141, a second extending portion 143, and a third extending portion 144. The second extending portion 143 and the third extending portion 144 can be coupled to two opposite ends of the first extending portion 141 respectively. The second extending portion 143 can be curved relative to the first extending portion 141. An end of the second extending portion 143 can start at the first portion 1281, and the second extending portion 143 can extend along the first portion 1281 to the flat portion 126. Thus, another end of the second extending portion 143 can be coupled to and communicate with the first extending portion 141.

The third extending portion 144 can be curved relative to the first extending portion 141. An end of the third extending portion 144 can start at the second portion 1283, and the third extending portion 144 can extend along the second portion 1283 to the flat portion 126. Thus, another end of the third extending portion 144 can be coupled to and communicate with the first extending portion 141. The first extending portion 141, the second extending portion 143, and the third extending portion 144 corporately form the C-shaped structure of the slot 14.

In this way, the slot 14 can extend on the first portion 1281, the flat portion 126 and the second portion 1283. As a result, the rear cover 10 can have a better appearance, and a length of the slot 14 can be lengthened. Thus, more paths for transmitting signals can be provided. Thus, a performance of transmitting signals of the electronic device 100 can be improved.

In accordance with one embodiment of the present disclosure, the rear cover 10 can provide four slots 14 therein (as illustrated in FIG. 3). Specifically, the rear cover 10 can further include a top end 101 and a bottom end 103 opposite to the top end 101. The rear cover 10 can define two slots 14 in the top end 101, and define two slots 14 in the bottom end 103. Each of the slots 14 can extend from the first portion 1281, across the flat portion 126 to the second portion 1283. In other words, the slot 14 can extend from a left border of the rear cover 10, and across the flat portion 126 to a right border of the rear cover 10. The slot 14 can pass the left and right sides of the rear cover 10. In other alternative embodiment, one or more slots 14 can be provided in the top end 101, while one or more slots 14 can be provided in the bottom end 103.

In accordance with the embodiments of the present disclosure, the housing 12 having a target shaped is provided in advanced, and then the slot 14 is defined in the housing 12, The rear cover 10 can be obtained after forming the unshielded portion 16 in the slot 14. A process of manufacturing the rear cover 10 is simplified, and a high utilization rate of raw materials can be achieved, thus the production efficiency can be increased and the production cost can be reduced.

In some alternative embodiments, the slot 14 can extend into the plastic layer 124. Thus the unshielded portion 16 can be partially received in and coupled to the plastic layer 124. In other words, the unshielded portion 16 can be partially embedded in the plastic layer 124.

In this way, the slot 14 can extend into the plastic layer 124. Thus, the metal layer 122 can be divided into two parts by the slot 14. In addition, the plastic layer 124 can not shield signals. Thus, the electronic device 100 can be capable of transmitting signals through the slot 14 to the outside of the electronic device 100, and receiving signals from the outside of the electronic device 100 through the slot 14.

In some embodiments, the unshielded portion 16 can be associated with a color uniformity of the second surface 1224. So that, the rear cover 10 can be more beautiful and the user experience can be improved.

As illustrated in FIG. 3, in accordance with one embodiment of the present disclosure, an electronic device 100 is provided. The electronic device 100 can include any of the rear covers 10 described above, and a cover plate (not illustrated). The cover plate can be coupled to the rear cover 10.

In accordance with the embodiments of the present disclosure, in the method for manufacturing the rear cover 10, the housing 12 having a target shaped is provided in advanced, and then the slot 14 is defined in the housing 12. The rear cover 10 can be obtained after forming the unshielded portion 16 in the slot 14. A process of manufacturing the rear cover 10 is simplified, and a high utilization rate of raw materials can be achieved, thus the production efficiency can be increased and the production cost can be reduced.

Figure 12:
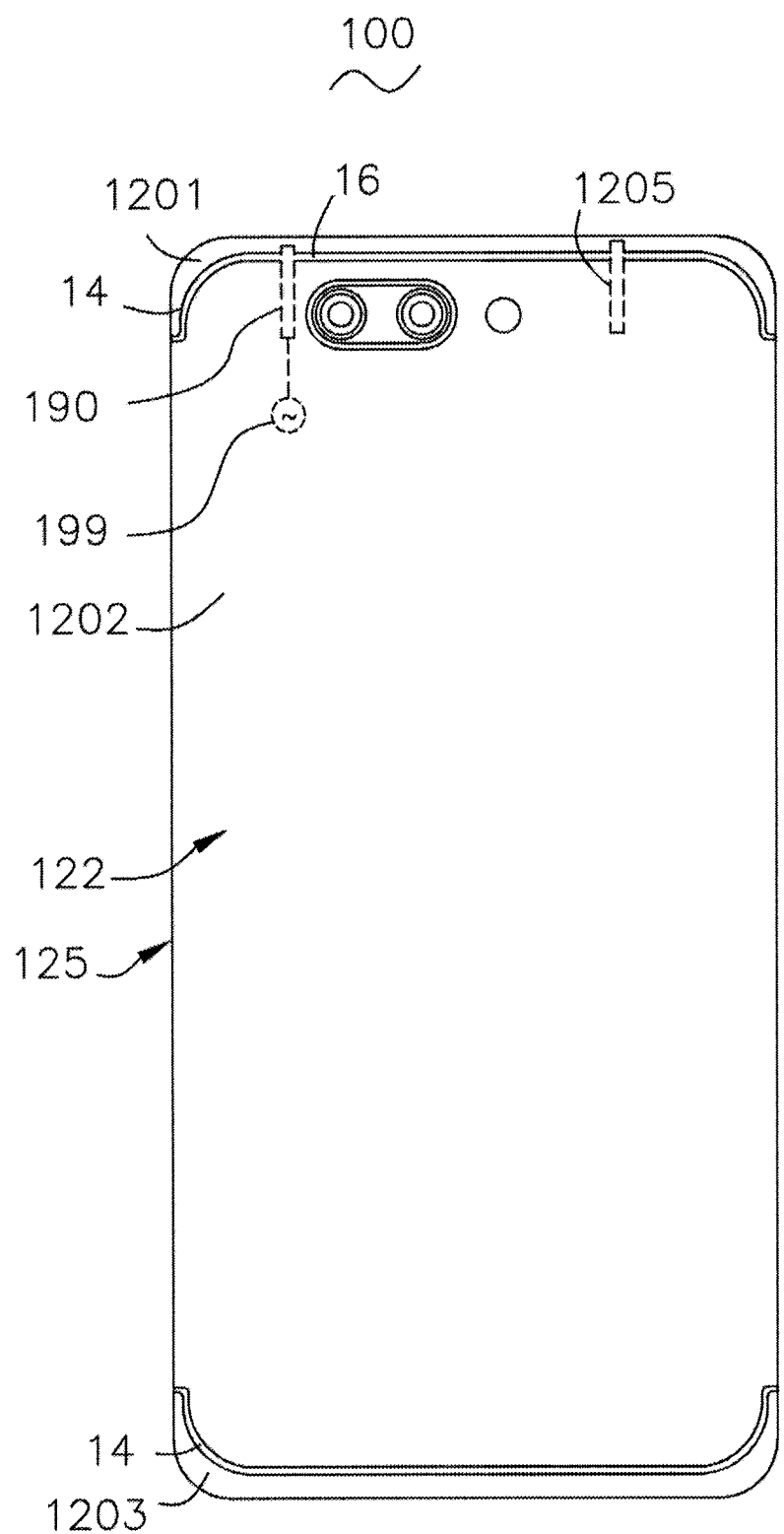
FIG. 12 illustrates a schematic view of an electronic device including a rear cover, in accordance with further another embodiment of the present disclosure.

As illustrated in FIG. 12, in accordance with one embodiment of the present disclosure, an electronic device 100 is provided. The electronic device 100 may be a cellular phone, a tablet computer, or a notebook computer. The electronic device 100 can at least include a base layer 125, a metal layer 122, an unshielded portion 16, and a feeding element 190. The metal layer 122 can be attached to the base layer 125; the unshielded portion 16 and the feeding element 190 can be coupled to the metal layer 122.

In some embodiments, and the feeding element 190 can be made of a metal such as silver, copper, or aluminum. The base layer 125 may be an FR4 substrate or a hard/soft composite board. In an alternative embodiment, the base layer 125 can be the plastic layer 124 described in the above embodiments. The electronic device 100 may further include other essential components, including but not limited to, a processing module, a touch module, a display module, a transparent panel, and a battery (not shown). Among them, the touch module may be integrated with the display module to form a touch-display module.

In some alternative embodiments, the metal layer 122 can be stacked on the base layer 125. The metal layer 122 can include an upper element 1201 and a main element 1202 spaced from the upper element 1201. A slot 14 can be formed between the upper element 1201 and the main element 1202. The feeding element 190 can be configured to electrically connect the main element 1202 to the upper element 1201. The unshielded portion 16 can be at least partially disposed in the slot 14.

In some alternative embodiment, the slot 14 may completely separate the upper element 1201 from the main element 1202. The electronic device 100 can further include a conductive element 1205, and the conductive element 1205 can extend across the slot 14 and electrically connect the upper element 1201 to the main element 1202. The conductive element 1205 can be an FPCB (Flexible Printed Circuit Board).

In the electronic device 100, an antenna structure can be formed by the feeding element 190, the upper element 1201, and the slot 14. The upper element 1201 can be a main radiation element of the antenna structure. The feeding element 190 may be coupled to the upper element 1201 to excite the antenna structure.

In the illustrated embodiment, the electronic device 100 can further include a signal source 199 coupled to the main element 1202. An end of the feeding element 190 can be coupled to the signal source 199, and another end of the feeding element 190 can extend across the slot 14 and couple to the upper element 1201. The signal source 199 can be further coupled to an RF (Radio Frequency) signal processing module (not illustrated). The feeding element 190 and the metal layer 122 may be disposed on different planes. In another embodiment, the feeding element 190 can be coupled through a metal spring (not illustrated) to the metal layer 120 to excite the antenna structure. In addition, the feeding element 190 may include a variable capacitor (not illustrated).

The feeding element 190 can be a portion of the antenna structure of the electronic device 100. Even if the feeding element 190 extends across the slot 14, the feeding element 190 does not affect the radiation performance of the antenna structure. Electromagnetic waves may be transmitted or received through the slot 14 by the antenna structure. Accordingly, the antenna structure can maintain good radiation efficiency.

In some alternative embodiments, the metal layer 122 can further include a lower element 1203. The lower element 1203 can be disposed at a side of the main element 1202 far away from the upper element 1201, and can be spaced from the main element 1202. Another slot 14 can be formed between the main element 1202 and the lower element 1203.

Figure 13:
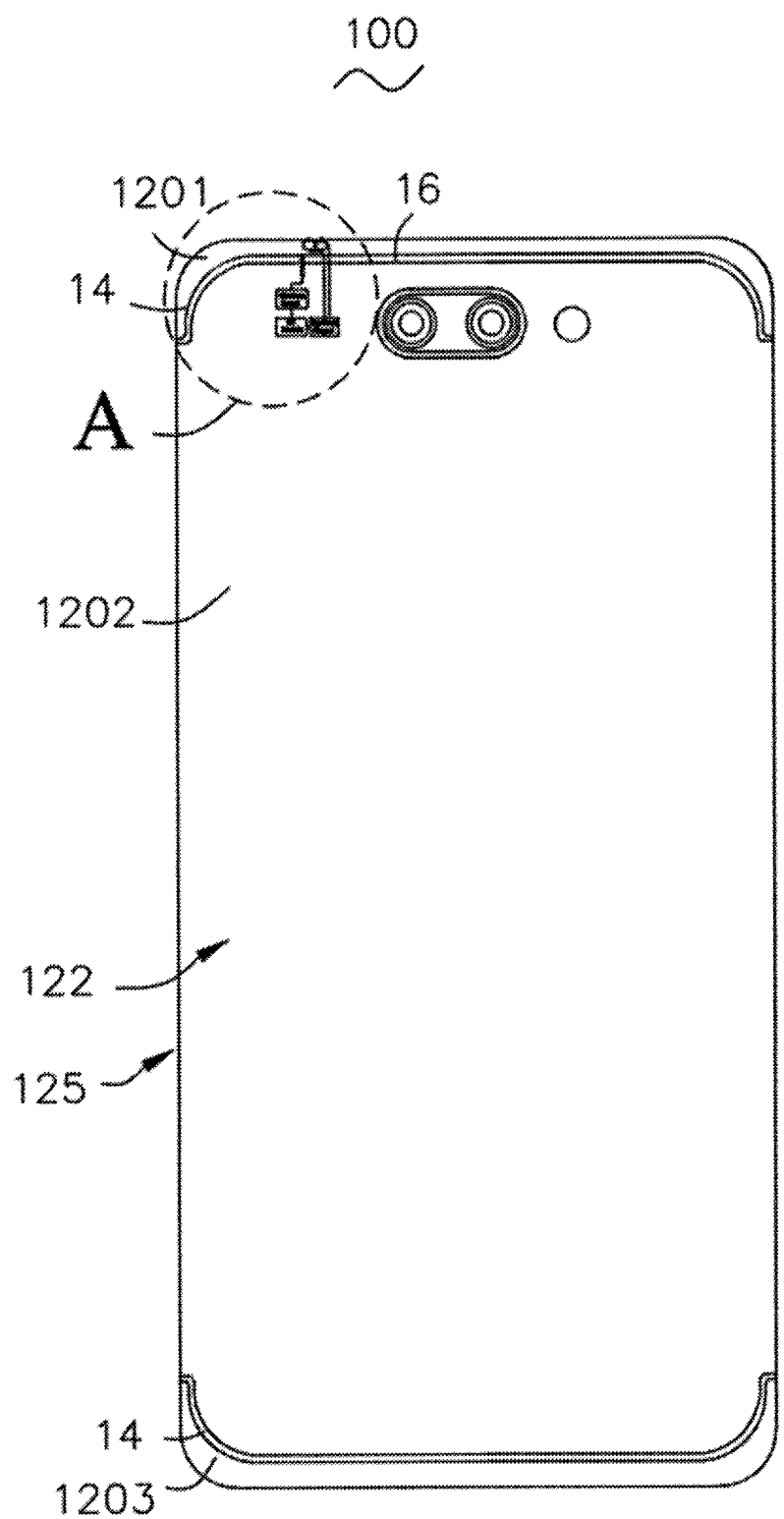
FIG. 13 illustrates a schematic view of an electronic device including a rear cover, in accordance with further another embodiment of the present disclosure.
Figure 14:
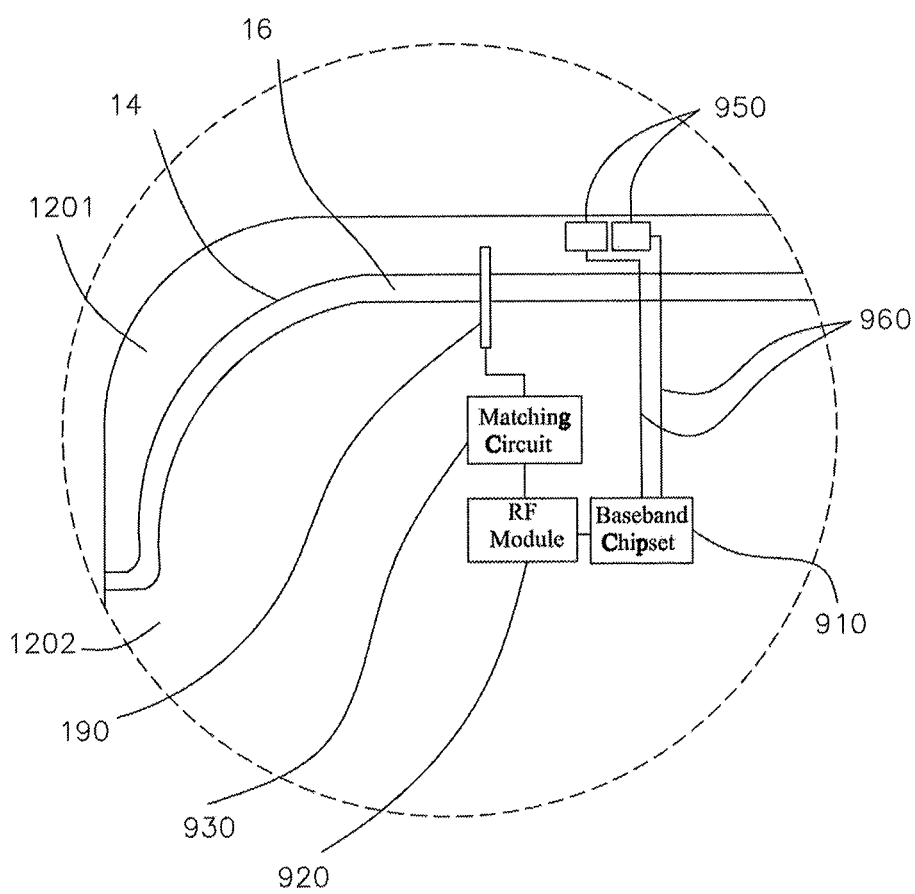
FIG. 14 illustrates an enlarged view of area A of FIG. 13.

As illustrated in FIG. 13 and FIG. 14, in an alternative embodiment, the electronic device 100 can further include a baseband chipset 910, an RF (Radio Frequency) module 920, and a matching circuit 930. In the embodiment, the baseband chipset 910, the RF module 920, and the matching circuit 930 can be disposed on the main element 1202 of the metal layer 122.

The baseband chipset 910 may be coupled through the RF module 920 and the matching circuit 930 to the feeding element 190 to excite the antenna structure of the electronic device 100. The baseband chipset 910 can be considered to be a signal source of the electronic device 100. In addition, the electronic device 100 can further include one or more electronic components 950, which may be disposed on the upper element 1201 or the lower element 1203. The electronic components 950 can include at least one of a speaker, a receiver, a microphone, a camera, a USB (Universal Serial Bus) socket, a memory card socket, a vibrator, and/or an audio jack. The electronic components 950 can be coupled through one or more metal traces 960 to the baseband chipset 910.

It is noticed that the electronic components 950 can be disposed on a non-slot region of the antenna structure of the electronic device 100, and the electronic components 950 can be considered to be a portion of the antenna structure. Accordingly, the electronic components 950 do not affect the radiation performance of the antenna structure. In the illustrated embodiment, the antenna structure can be integrated with the electronic components 950, and the inner space of the electronic device 100 can be effectively saved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A rear cover, comprising,
   a housing having a metal layer and a plastic layer; the metal layer having a first surface and a second surface, the plastic layer being formed on the first surface; wherein the metal layer defines a slot therein, and the slot passes through the first surface and the second surface of the metal layer; wherein the housing comprises a flat portion and a sidewall extending from a periphery of the flat portion, the sidewall comprises a first portion and a second portion, the first portion and the second portion are coupled to opposite sides of the flat portion, and the slot extends from the first portion to the second portion; and
   an unshielded portion, disposed in the slot.

2. The rear cover as claimed in claim 1, wherein the first surface is a nanocrystallized surface.

3. The rear cover as claimed in claim 1, wherein the second surface is an anode oxidized surface.

4. The rear cover as claimed in claim 1, wherein the unshielded portion is made of a material different from the plastic layer.

5. The rear cover as claimed in claim 1, wherein the slot extends into the plastic layer, the unshielded portion is partially embedded in the plastic layer.

6. The rear cover as claimed in claim 1, wherein the unshielded portion is associated with a color uniformity of the second surface.

7. The rear cover as claimed in claim 1, wherein the slot extends along a contour of the housing, the contour of the housing is a rounded rectangle, and the slot substantially has a C-shape.

8. The rear cover as claimed in claim 1, wherein the housing defines at least one through hole therein, wherein the at least one through hole is configured to accommodate components of an electronic device having the rear cover.

9. The rear cover as claimed in claim 1, wherein a depth of the slot is greater than a thickness of the metal layer, and the depth of the slot is less than a sum of the thickness of the metal layer and a thickness of the plastic layer.

10. The rear cover as claimed in claim 9, wherein the metal layer is divided into two parts by the slot, and the two parts of the metal layer are coupled to each other by the plastic layer and the unshielded portion.

11. The rear cover as claimed in claim 1, wherein a depth of the slot is equal to a sum of a thickness of the metal layer and a thickness of the plastic layer.

12. The rear cover as claimed in claim 1, wherein the slot extends along a contour of the housing and has a first extending portion, a second extending portion, and a third extending portion; the second extending portion and the third extending portion are coupled to two opposite ends of the first extending portion; and the first extending portion, the second extending portion, and the third extending portion cooperatively form a C-shaped structure of the slot.

13. The rear cover as claimed in claim 12, an end of the second extending portion starts at the first portion, the second extending portion extends along the first portion to the flat portion, and another end of the second extending portion is coupled to and communicates with the first extending portion; an end of the third extending portion starts at the second portion, the third extending portion extends along the second portion to the flat portion, and another end of the third extending portion is coupled to and communicates with the first extending portion.

14. A rear cover, comprising,
  a housing having a metal layer and a plastic layer; the metal layer having a first surface and a second surface, the plastic layer being formed on the first surface; wherein the metal layer defines a slot therein, and the slot passes through the first surface and the second surface of the metal layer; and
  an unshielded portion being disposed in the slot, wherein the unshielded portion is associated with a color uniformity of the second surface.

15. The rear cover as claimed in claim 14, wherein the slot extends into the plastic layer, the unshielded portion is partially embedded in the plastic layer, and the unshielded portion is made of a material different from the plastic layer.

16. The rear cover as claimed in claim 14, wherein the slot extends along a contour of the housing and has a first extending portion, a second extending portion, and a third extending portion; the second extending portion and the third extending portion are coupled to two opposite ends of the first extending portion; and the first extending portion, the second extending portion, and the third extending portion cooperatively form a C-shaped structure of the slot.

17. A rear cover, comprising,
  a housing having a metal layer and a plastic layer; the metal layer having a first surface and a second surface, the plastic layer being formed on the first surface; wherein the metal layer defines a slot therein, and the slot passes through the first surface and the second surface of the metal layer;
  wherein the housing defines at least one through hole therein, wherein the at least one through hole is configured to accommodate components of an electronic device; and
  an unshielded portion, disposed in the slot.

18. The rear cover as claimed in claim 17, wherein the slot extends into the plastic layer, and the unshielded portion is partially embedded in the plastic layer and associated with a color uniformity of the second surface.

19. The rear cover as claimed in claim 17, wherein the slot extends along a contour of the housing and has a first extending portion, a second extending portion, and a third extending portion; the second extending portion and the third extending portion are coupled to two opposite ends of the first extending portion; the second extending portion is curved relative to the first extending portion; and the third extending portion is curved relative to the first extending portion.

20. The rear cover as claimed in claim 19, wherein the first extending portion, the second extending portion, and the third extending portion cooperatively form a C-shaped structure of the slot.

* * * * *